(12) United States Patent
Scott et al.

(10) Patent No.: US 6,385,747 B1
(45) Date of Patent: May 7, 2002

(54) TESTING OF REPLICATED COMPONENTS OF ELECTRONIC DEVICE

(75) Inventors: Jeffery Burl Scott, Durham; Kenneth Michael Key; Michael L. Wright, both of Raleigh; Scott Nellenbach, Apex, all of NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/212,314

(22) Filed: Dec. 14, 1998

(51) Int. Cl.$^7$ .............................................. G11C 29/00
(52) U.S. Cl. ...................... 714/724; 365/201
(58) Field of Search ................. 714/724, 735, 714/736, 30

(56) References Cited

U.S. PATENT DOCUMENTS

| | | | | |
|---|---|---|---|---|
| 4,583,041 A | * | 4/1986 | Kimura ...................... | 714/735 |
| 4,590,554 A | | 5/1986 | Glazer et al. ................. | 714/13 |
| 4,598,400 A | | 7/1986 | Hillis ......................... | 370/400 |
| 4,709,327 A | | 11/1987 | Hillis et al. .................... | 712/14 |
| 4,773,038 A | | 9/1988 | Hillis et al. .................... | 703/20 |
| 4,791,641 A | | 12/1988 | Hillis ......................... | 714/757 |
| 4,805,091 A | | 2/1989 | Thiel et al. .................... | 712/12 |
| 4,809,202 A | | 2/1989 | Wolfram ....................... | 703/9 |
| 4,870,568 A | | 9/1989 | Kahle et al. ................... | 707/5 |
| 4,922,486 A | | 5/1990 | Lidinsky et al. ............. | 370/427 |
| 4,965,717 A | | 10/1990 | Cutts, Jr. et al. ............. | 714/12 |
| 4,993,028 A | | 2/1991 | Hillis ......................... | 714/762 |
| 5,070,446 A | | 12/1991 | Salem ......................... | 703/21 |
| 5,111,198 A | | 5/1992 | Kuszmaul .............. | 340/825.52 |

(List continued on next page.)

OTHER PUBLICATIONS

U.S. application No. 09106,478, Kerr et al., filed Jun. 29, 1998.

IEEE 1149.1 Device Architecture (continued) Using the Instruction Register, http://www.asset–interech.com/homepage/bscantutr/arch2.htm#using IR, pp. 1–4, 1998.

The Principle of Boundary–Scan Architecture, http://www.asset–intertech.com/homepage/bscantutr/principl.htm, pp. 1–4, 1998.

IEEE 1149.1 Device Architecture, http//www.asset–interech.com/homepage/bscantutr/arch.htm, pp. 1–3, 1998.

IEEE 1149.1 Device Architecture (continued), http://www.asset–intertech.com/homepage/bscantutr/arch3.htm#TAP, pp. 1–3. 1998.

Digital Systems Testing and Testable Design, Miron Abramovici, et al., Computer Science Press, pp. 342–409, Copyright 1990.

*Primary Examiner*—Albert DeCady
*Assistant Examiner*—Shelly A Chase
(74) *Attorney, Agent, or Firm*—Cesari and McKenna, LLP; A. Sidney Johnston

(57) ABSTRACT

A technique is provided for use in testing replicated components (e.g., identical circuit components) of an electronic device for defects. In one aspect of this testing technique, the same test inputs may be broadcast, in parallel, from a single test interface to each of the replicated components of the electronic device under test. Respective test outputs generated by the replicated components in response to the test inputs may be supplied to a comparator, comprised in the electronic device, that compares the respective test outputs to each other and generates a fault signal if corresponding test outputs are not identical. This fault signal may be supplied to an external test interface pin of the single test interface, and its assertion may indicate that one or more of the replicated components may be defective. The respective test outputs may be multiplexed to permit output via an external interface of respective test outputs from a selected component. These respective test outputs may be compared to expected values therefor whereby to determine presence and/or nature of defects in the replicated components.

20 Claims, 5 Drawing Sheets

U.S. PATENT DOCUMENTS

| | | | |
|---|---|---|---|
| 5,113,510 A | 5/1992 | Hillis | 711/121 |
| 5,117,420 A | 5/1992 | Hillis et al. | 370/400 |
| 5,129,077 A | 7/1992 | Hillis | 712/13 |
| 5,148,547 A | 9/1992 | Kahle et al. | 712/22 |
| 5,151,996 A | 9/1992 | Hillis | 712/15 |
| 5,157,663 A | 10/1992 | Major et al. | 714/10 |
| 5,175,865 A | 12/1992 | Hillis | 712/13 |
| 5,212,773 A | 5/1993 | Hillis | 709/243 |
| 5,222,216 A | 6/1993 | Parish et al. | 710/136 |
| 5,222,237 A | 6/1993 | Hillis | 712/204 |
| 5,247,613 A | 9/1993 | Bromley | 709/246 |
| 5,247,694 A | 9/1993 | Dahl | 712/13 |
| 5,255,291 A | 10/1993 | Holden et al. | 375/362 |
| 5,261,105 A | 11/1993 | Potter et al. | 710/105 |
| 5,265,207 A | 11/1993 | Zak et al. | 712/15 |
| 5,274,631 A | 12/1993 | Bhardwaj | 370/401 |
| 5,289,156 A | 2/1994 | Ganmukhi | 340/146.2 |
| 5,295,258 A | 3/1994 | Jewett et al. | 714/12 |
| 5,301,310 A | 4/1994 | Isman et al. | 714/5 |
| 5,317,726 A | 5/1994 | Horst | 714/12 |
| 5,355,492 A | 10/1994 | Frankel et al. | 717/7 |
| 5,357,612 A | 10/1994 | Alaiwan | 109/216 |
| 5,361,363 A | 11/1994 | Wells et al. | 712/22 |
| 5,367,692 A | 11/1994 | Edelman | 712/22 |
| 5,388,214 A | 2/1995 | Leiserson et al. | 712/15 |
| 5,388,262 A | 2/1995 | Hillis | 712/204 |
| 5,390,298 A | 2/1995 | Kuszmaul et al. | 712/22 |
| 5,404,296 A | 4/1995 | Moorhead | 702/14 |
| 5,404,562 A | 4/1995 | Heller et al. | 712/18 |
| 5,455,932 A | 10/1995 | Major et al. | 711/162 |
| 5,485,627 A | 1/1996 | Hillis | 712/13 |
| 5,530,809 A | 6/1996 | Doulas et al. | 709/250 |
| 5,535,408 A | 7/1996 | Hillis | 712/16 |
| 5,561,669 A | 10/1996 | Lenney et al. | 370/352 |
| 5,617,538 A | 4/1997 | Heller | 709/245 |
| 5,621,885 A | 4/1997 | Del Vigna, Jr. | 714/13 |
| 5,627,965 A | 5/1997 | Liddell et al. | 714/48 |
| 5,673,423 A | 9/1997 | Hillis | 709/400 |
| 5,710,814 A | 1/1998 | Klemba et al. | 713/173 |
| 5,732,209 A * | 3/1998 | Vigil et al. | 714/30 |
| 5,742,604 A | 4/1998 | Edsall et al. | 370/401 |
| 5,751,955 A | 5/1998 | Sonnier et al. | 714/12 |
| 5,764,636 A | 6/1998 | Edsall | 370/401 |
| 5,787,255 A | 7/1998 | Parlan et al. | 709/233 |
| 5,809,040 A * | 9/1998 | Dallmann et al. | 714/736 |
| 5,838,915 A | 11/1998 | Klausmeier et al. | 702/215 |
| 5,944,846 A * | 8/1999 | Fournel et al. | 714/724 |
| 5,996,099 A * | 11/1999 | Fournel et al. | 714/724 |
| 6,006,346 A * | 12/1999 | Fournel et al. | 714/724 |
| 6,101,599 A | 8/2000 | Wright et al. | 712/228 |
| 6,119,215 A | 9/2000 | Key et al. | 212/19 |
| 6,173,386 B1 | 1/2001 | Key et al. | 712/10 |
| 6,195,739 B1 | 2/2001 | Wright et al. | 712/10 |

* cited by examiner

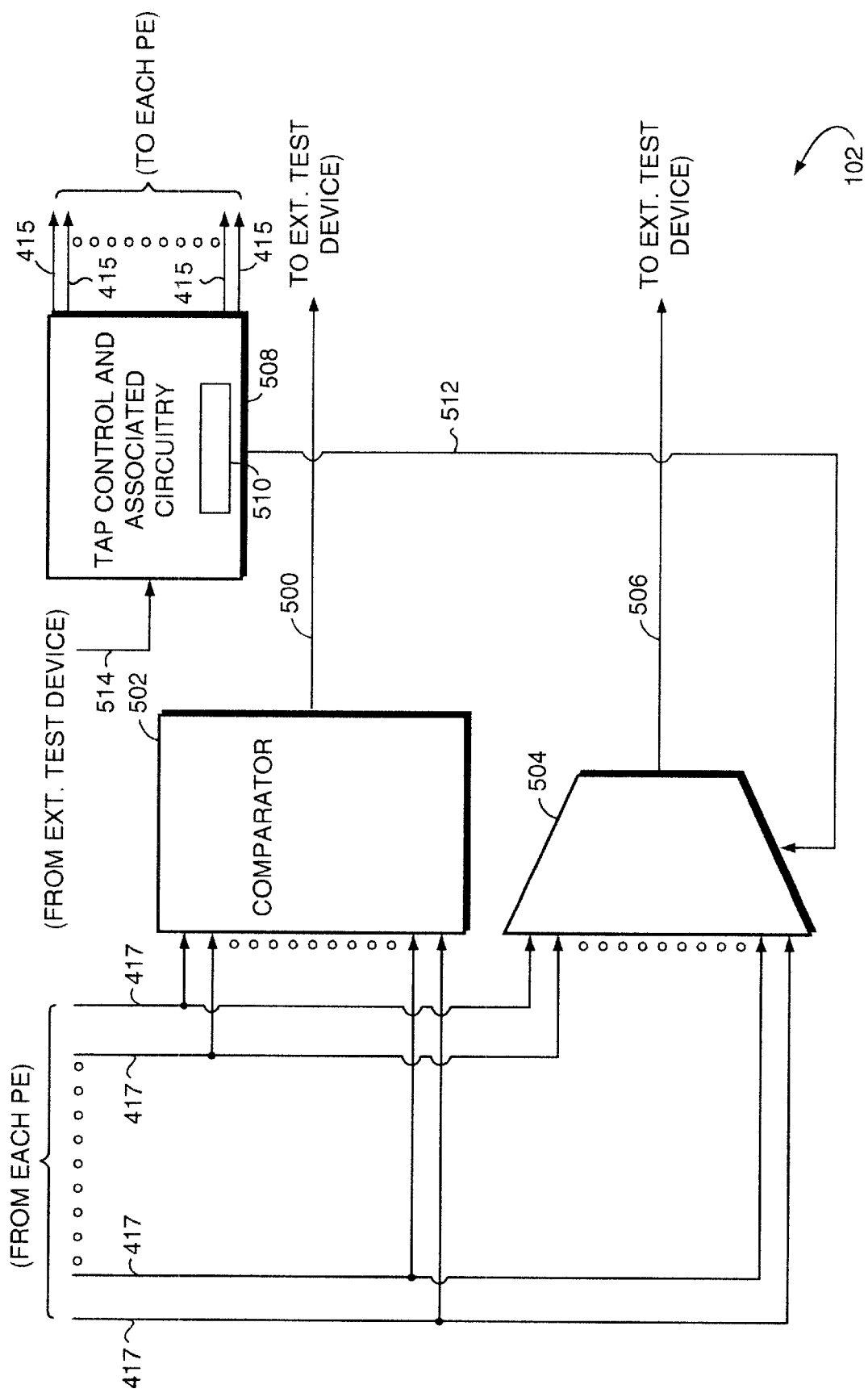

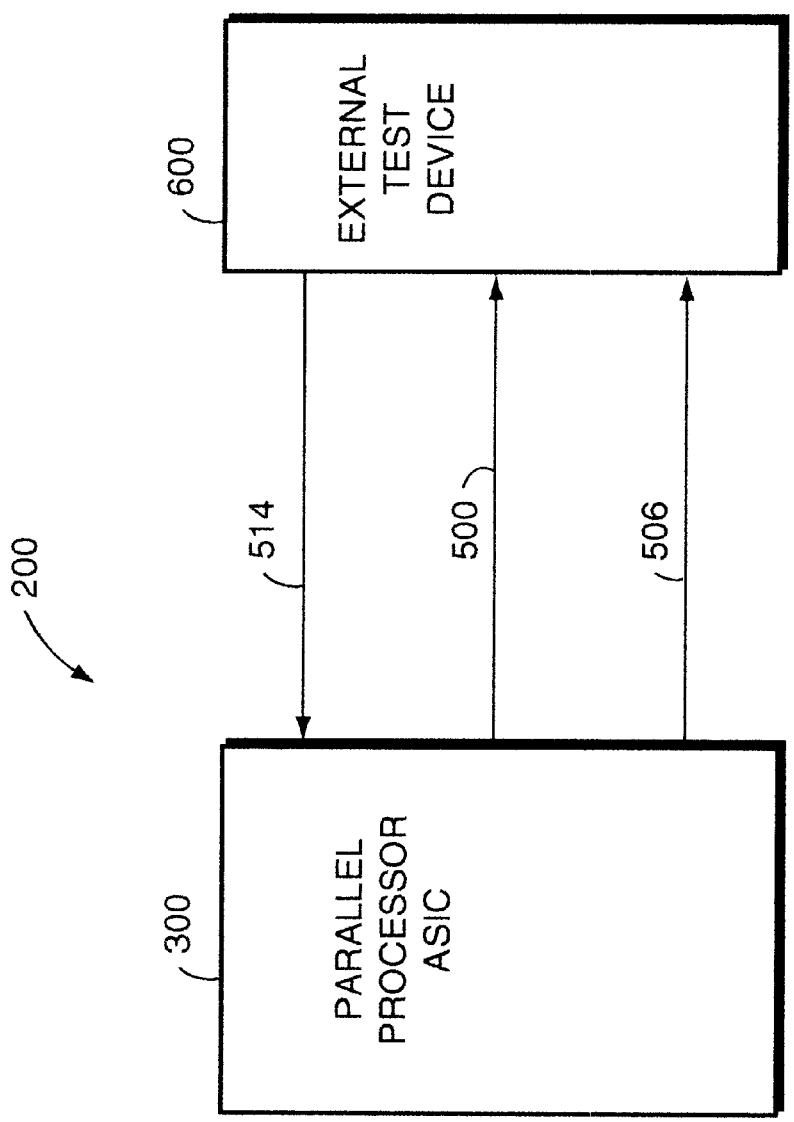

TESTING OF REPLICATED COMPONENTS OF ELECTRONIC DEVICE

CROSS-REFERENCE TO RELATED APPLICATIONS

The subject application is related to the following copending applications:

U.S. patent application Ser. No. 09/106,478, filed Jun. 29, 1998, entitled "PROGRAMMABLE ARRAYED PROCESSING ENGINE ARCHITECTURE FOR A NETWORK SWITCH"; U.S. patent application Ser. No. 09/106,436 now U.S. Pat. No. 6,195,739 entitled, "ARCHITECTURE FOR A PROCESSOR COMPLEX OF AN ARRAYED PIPELINED PROCESSING ENGINE," filed Jun. 29, 1998; now U.S. Pat. No. 6,195,739; U.S. patent application Ser. No. 09/106,244, entitled, "SYSTEM FOR CONTEXT SWITCHING BETWEEN PROCESSING ELEMENTS IN A PIPELINE OF PROCESSING ELEMENTS," filed Jun. 29, 1998; now U.S. Pat. No. 6,101,599 U.S. patent application Ser. No. 09/106,246 entitled, "SYNCHRONIZATION AND CONTROL SYSTEM FOR AN ARRAYED PROCESSING ENGINE," filed Jun. 29, 1998 now U.S. Pat. No. 6,119,215; and U.S. patent application Ser. No. 09/213,291 entitled "PARALLEL PROCESSOR WITH DEBUG CAPABILITY", now U.S. Pat. No. 6,173,386 filed concurrently with the subject application, whose serial number has yet to be assigned. Each of said copending applications is assigned to the Assignee of the subject application, and is incorporated herein by reference in its entirety.

BACKGROUND OF THE INVENTION

1. Field of the Invention

The present invention relates to testing of replicated (i.e., identical) components of an electronic device. Although the present invention will be described in connection with testing of replicated electronic components of a parallel processor integrated circuit, other utilities are also contemplated for the present invention, including use in testing of replicated electronic components in other types of electronic devices and systems.

2. Brief Description of Related Prior Art

A parallel processor computer system may be implemented using a number of replicated central processing units (CPUs) or processors to perform certain tasks in parallel. Such a parallel processor computer system may be fabricated as a single application specific integrated circuit (ASIC) chip exhibiting a relatively high degree of on-chip circuit integration. Unfortunately, this high degree of integration can make it difficult and is time consuming to test the chips' replicated CPUs for defects.

One partial solution to this problem has been to include among the features of the parallel processor ASIC, on-chip systems for facilitating testing of the replicated CPUs after manufacture, but prior to supply of the ASIC to its intended end user. One such conventional on-chip system includes respective on-chip serial interfaces by which test clock signals, test control signals and serial test vectors (hereinafter collectively referred to as "test inputs") may be input, in parallel, from off-chip test logic to respective serial scan test circuitry comprised in the respective parallel processor CPUs, and also by which the serial test output signals (hereinafter "test outputs") generated by the CPUs in response to the test inputs may be supplied, in parallel, to the off-chip test logic. The off-chip test logic compares the actual test outputs received from the chip to predetermined values that are expected for same if the CPUs are operating normally (i.e., there are no manufacturing or design defects in the CPUs). Depending upon the degree to which the actual test outputs conform to the values expected for same, the off-chip test logic will indicate either that the parallel processor chip has passed the test (i.e., no defects were determined by the logic to be present in the CPUs of the chip), or has failed the test (i.e., defects are present in one or more of the CPUs).

Unfortunately, although this conventional testing technique permits the amount of time necessary to carry out testing of the ASIC's CPUs to be substantially reduced, it also requires a number of serial test interfaces equal to the number of CPUs in the ASIC being tested. Thus, since each respective serial test interfaces typically includes multiple respective external test interface pins (e.g., to propagate respective test inputs to the respective CPU connected to the respective interface), the number of external test interface pins required to implement this technique is equal to N * P, wherein N represents the number of CPUs of the parallel processor chip being tested, and P represents the number of external test interface pins in each serial test interface. Disadvantageously, the relatively large number of test pins required to implement this technique consumes an undesirably large amount of parallel processor chip I/O pins.

A second such conventional testing technique involves coupling the respective serial scan test circuitry of the individual CPUs together to form, in essence, a single serial scan test chain connected to a single on-chip serial test interface. This second conventional testing technique has the advantage that the number of external test interface pins required to implement this technique is much less than is required to implement the first conventional technique described above. That is, since only a single interface is required to implement this second conventional testing technique, the number of external test interface pins required to implement this second technique may be reduced by a factor of N compared to the first conventional technique. Disadvantageously, however, more time is required to carry out testing of the chip using the second technique than is required to carry out such testing using the first technique. This is because, in the second technique, the scan chain used to carry out testing has a length that is, in essence, equal to the sum of the lengths of each of the scan chains of the respective CPUs. Thus, as can be readily appreciated, the time required to propagate the test inputs and outputs through the scan chain used in the second technique is substantially greater than the time required to propagate the test inputs and outputs, in parallel, through each of the CPUs' scan chains, as in the first technique.

In a modification of the second conventional technique, a single serial scan test chain is not formed, but rather, multiplexer circuitry is provided to permit each of the individual CPUs to be separately, sequentially tested via the single test interface, using each respective CPU's scan test chain separately. Unfortunately, this modification of the second conventional technique suffers from the aforesaid disadvantages of the second conventional technique.

Thus, it would be desirable to provide a technique for testing the replicated CPUs of a parallel processor chip that is able to achieve the advantages of the conventional testing techniques described above, without suffering from the disadvantages of these conventional techniques. More specifically, it would be desirable to provide a technique for testing the replicated CPUs of a parallel processor chip that is able to carry out such testing in a time substantially equal to that required by the first conventional technique, but that can be implemented using fewer external test interface pins than are required to implement the first conventional technique (i.e., fewer than N*P).

SUMMARY OF THE INVENTION

In accordance with the present invention, a testing technique is provided that may be used to test the replicated CPUs of a parallel processor, and that is able to achieve the advantages of the aforedescribed conventional testing techniques, without suffering from the disadvantages of said conventional techniques.

In broad concept, in one aspect of the testing technique of the present invention, the same test inputs may be broadcast, in parallel, from a single test interface (e.g., an external serial test interface) to (e.g., respective scan test chains of) each of the replicated components (e.g., replicated CPUs) of the electronic device (e.g., the parallel processor ASIC chip) under test. Respective test outputs generated by the replicated components in response to the test inputs may be supplied to a comparator, comprised in the interface, that compares the respective test outputs to each other and generates a fault signal if (e.g., all) corresponding test outputs are not identical. This fault signal may be supplied to an external test interface pin of the single test interface to indicate to an external testing device that one or more of the replicated components may be defective.

In another aspect of the present invention which may be practiced either alone or in conjunction with the first aspect of the present invention, a multiplexer may be provided in the electronic device to receive, in parallel, the respective test outputs from the replicated components, and to supply selected test outputs of a selected one of the replicated components to an external pin of the test interface, based upon a selection signal received from test control circuitry comprised in the test interface. A special register comprised in the test control circuitry may be loaded, based upon test control signals supplied to the circuitry, with a data value indicative of which of the test outputs is to be output to the external pin. The selection signal supplied to the multiplexer may be generated based upon the data value loaded into the special register.

Thus, according to the present invention, only a single external test interface may be required to test the replicated components of an electronic device, and this interface need only include a single additional external interface pin (i.e., the pin for propagating the fault signal) compared to the aforesaid prior art external test interfaces. Also in the present invention, propagation of test inputs to each of the replicated components from the test interface, and propagation of the test outputs from each of the replicated components to the test interface, respectively, may take place in parallel. Thus, advantageously, when the testing technique of the present invention is used to test the replicated CPUs of a parallel processor, such testing (1) may be carried out in a time substantially equal to that required by the first conventional technique and (2) may be implemented using fewer external test interface pins than are required to implement the first conventional technique (i.e., fewer than N*P).

The aforesaid and other features and advantages of the present invention will become apparent as the following Detailed Description proceeds, and upon reference to the Drawings, wherein like numerals depict like parts, and in which:

BRIEF DESCRIPTION OF THE DRAWINGS

FIG. 4 is a more detailed schematic diagram of the external test interface of the parallel processor of FIG. 1.

FIG. 5 is a highly schematic diagram wherein the parallel processor of FIG. 1 is shown in conjunction with an external testing device in order to facilitate discussion of the manner in which the replicated CPUs of the parallel processor may be tested in accordance with this embodiment of the present invention.

As will be appreciated by those skilled in the art, although the following Detailed Description will proceed with reference being made to specific embodiments and methods of use, the present invention is not intended to be limited to these embodiment and methods of use. Rather, the present invention is intended to be viewed broadly as encompassing all alternatives, modifications, and variations from these embodiments and methods of use as are included within the spirit and broad scope of the hereinafter appended claims.

DETAILED DESCRIPTION OF ILLUSTRATIVE EMBODIMENTS

Figure 1:
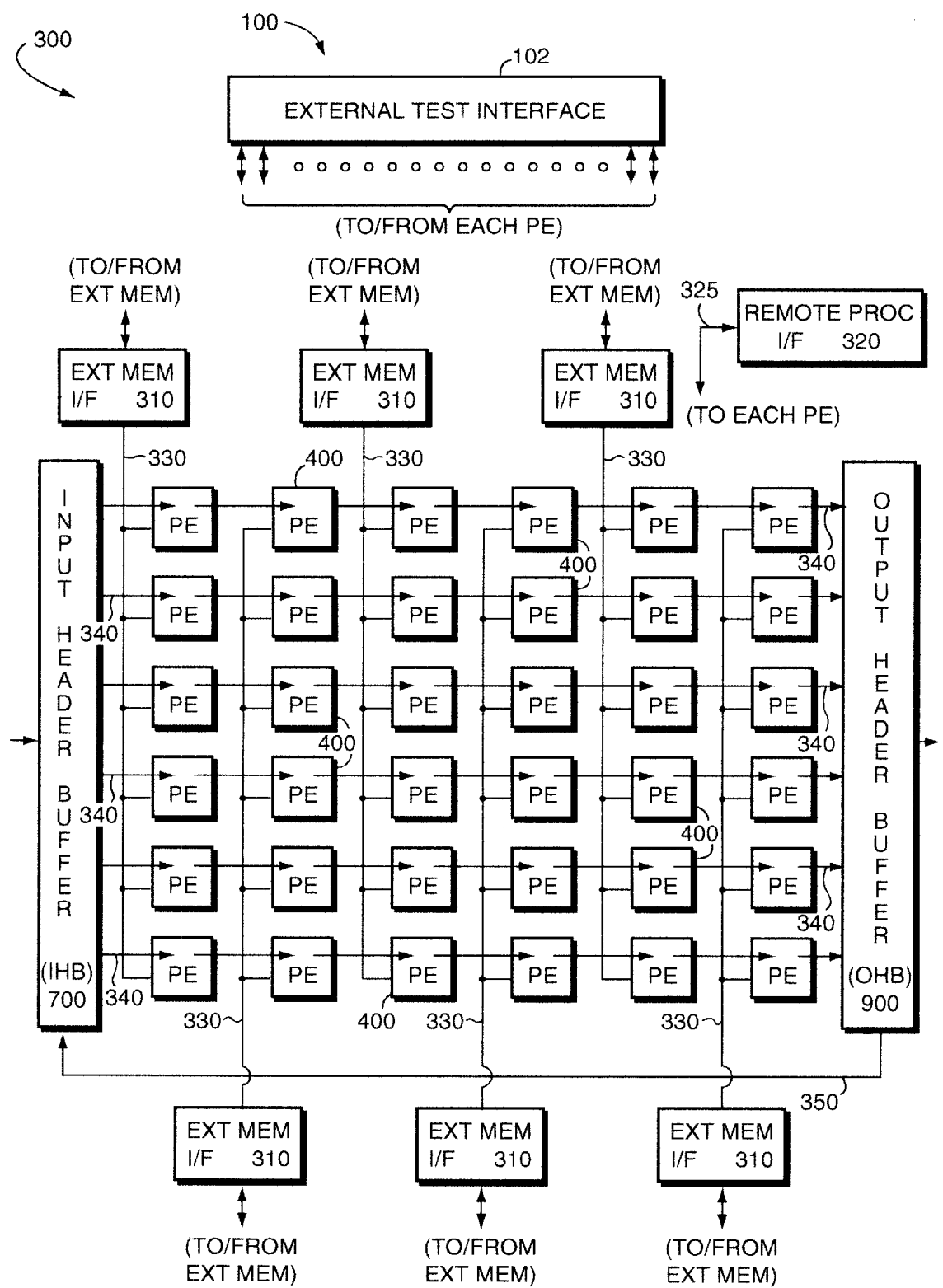
FIG. 1 is a highly schematic diagram of a parallel processor ASIC device comprising features in accordance with one embodiment of the present invention.

FIG. 1 is a high level functional schematic diagram of a programmable parallel processor ASIC chip 300 that comprises integrated test circuitry (collectively referred to by numeral 100) in accordance with one embodiment of the present invention. As described in the aforesaid copending applications, one use contemplated for the processor 300 is as a processing engine in an intermediate network station (e.g., network router or switch, not shown) for processing header information from Internet Protocol (IP) packets received by the station. More specifically, in this contemplated use of the processor 300, the processor 300 may process the packet header information to generate modified header information which includes the address of the "next hop" station (not shown) in the network for the packet, along with additional information (e.g., packet queuing information). Although processor 300 will be described herein in connection with this utility, it should be understood that other utilities are also contemplated for processor 300.

Programmable processor 300 includes an array of processing elements embedded between input and output header buffers with a plurality of interfaces from the array to an external memory. The external memory stores non-transient data organized within data structures for use in processing transient data (e.g., packet header information). The non-transient data typically includes "table" data contained in forwarding and routing tables, statistics, access filters, encryption keys and/or queuing information.

More specifically, processor 300 comprises a plurality of replicated processing elements (PEs) 400 symmetrically arrayed as six (6) rows and six (6) columns in a 6×6arrayed configuration that is embedded between an input header buffer (IHB) 700 and an output header buffer (OHB) 900; it is important to note, however, that if appropriately modified, the processor 300 may instead comprise a 3×3, 4×4, or other symmetrically arranged square array of elements 400 without departing from the present invention. A 64-bit feedback path 350 couples the OHB 900 to the IHB 700 and provides a data path for recycling data through the PE stages of the processing engine. The PEs of each row are configured as stages connected in series by a 100 MHz 64-bit direct memory access (DMA) data path 340 that synchronously transfers data and control "context" from one PE to the next. This arrangement enables data processing to occur as a high-level pipeline that sequentially executes operations on "transient data." The PEs of each column operate in parallel to perform substantially the same operation on that data, but with a shifted phase.

Figure 2:
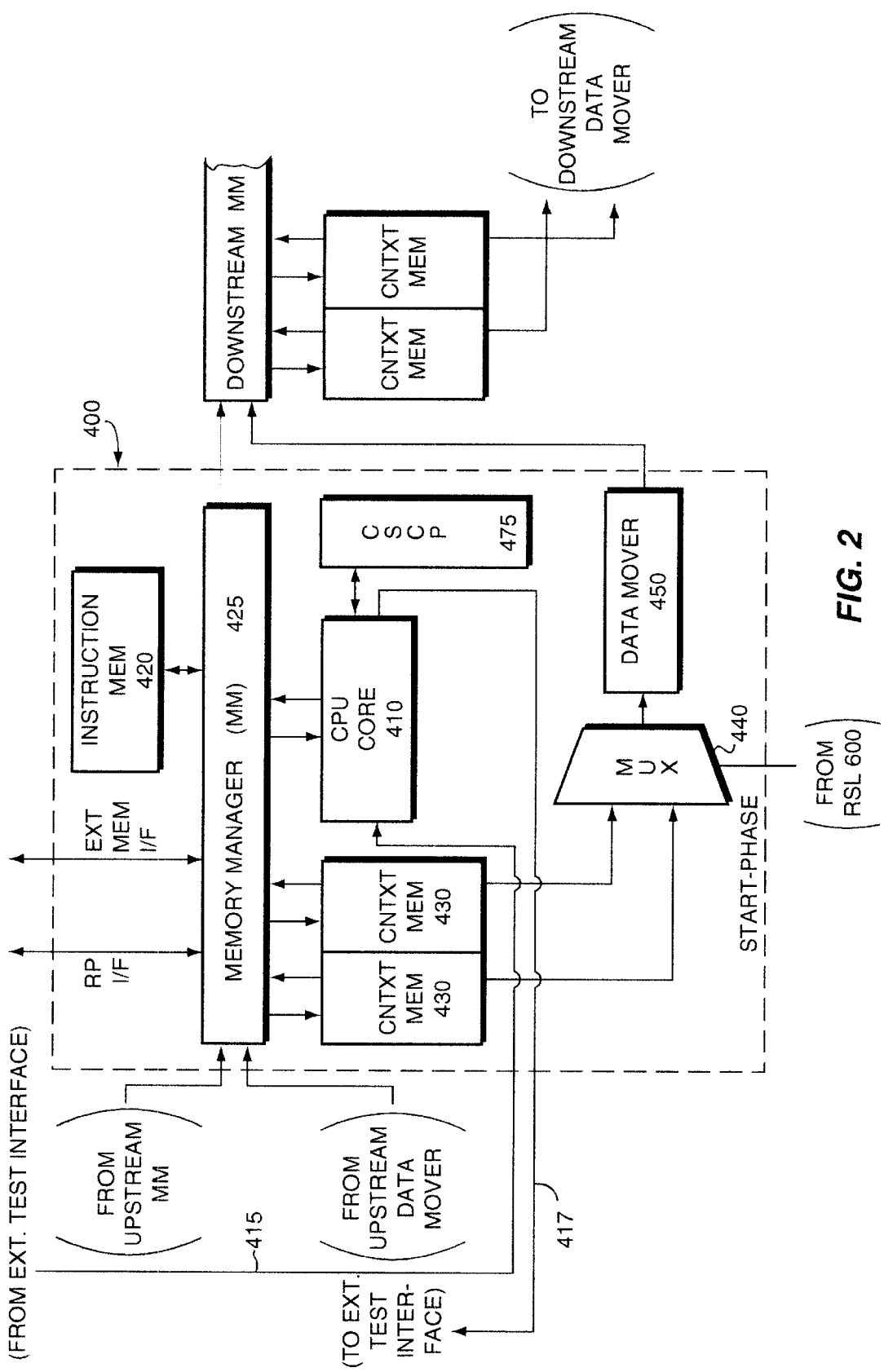
FIG. 2 is a highly schematic diagram of a processor complex element of the device of FIG. 1.
Figure 3:
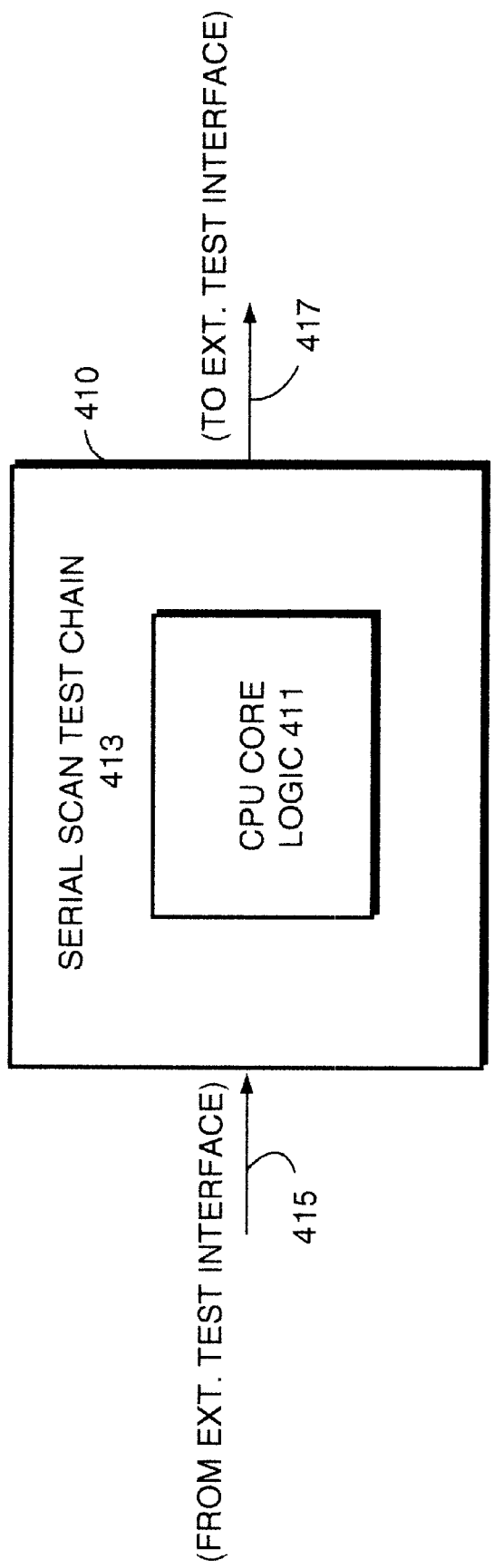
FIG. 3 is a more detailed schematic diagram of the CPU core of the processor complex element of FIG. 2, wherein connections from the CPU core other than those used for implementing testing of the core are not shown, for purposes of simplicity of illustration.

FIG. 2 is a schematic block diagram of a PE 400. Each PE is a processor complex that comprises a central processing unit (CPU) core 410 coupled to an instruction memory 420 and a pair of context data memory (Cntxt Mem) structures 430 via a memory manager (MM) circuit 425. The context memories store transient "context" data for processing by the CPU core in accordance with instructions stored in the instruction memory. The MM 425 provides the instructions and data to the CPU core in response to requests for that information. The MM also provides an interface to a partitioned memory resource configured to store non-transient data for use by the CPU.

The architecture of the PE 400 facilitates passing of context data among the PE stages of the engine in an efficient and accurate manner. To that end, the PE 400 further comprises a data mover circuit 450 that cooperates with the context memories 430 and MM 425 to pass data among PE stages in a manner that maintains data coherency in the processing engine. The data mover generally comprises an address incrementor and interface logic, including a context size register that specifies the length of the data to be moved. An example of a processing complex element whose functionality is suitable for use with the present invention is described in the aforesaid copending application entitled, "ARCHITECTURE FOR A PROCESSOR COMPLEX OF AN ARRAYED PIPELINED PROCESSING ENGINE," Ser. No. 09/106,436, filed Jun. 29, 1998.

Because they perform similar functions, the columned PEs require similar non-transient data. Therefore, the external memory is partitioned into a plurality of external memory (Ext Mem) resources, each of which is dedicated to a respective column of PEs and further configured with non-transient table data needed to support the similar function performed by the columned processor elements. Referring again to FIG. 1, each column has a dedicated 100 MHz 32-bit external memory interface data path (Ext Mem I/F) 310 for accessing the non-transient data.

Partitioning of the external memory (not shown) so that each PE stage of a pipeline has exclusive access to a dedicated memory resource allows the arrayed processing engine to satisfy high bandwidth requirements of the switch. The processing engine architecture obviates the need for memory accesses external to the engine to retrieve transient data by storing the packet data in an internal memory of each PE. Non-transient table data, on the other hand, are stored in partitioned external memory resources.

A memory bus 330 couples each of the columned PEs to its dedicated memory resource. Sharing of a resource, such as bus 330, typically necessitates arbitration to avoid contention among the processor elements. However, each of the columned PEs performs its operation at a different, staggered time with respect to the other columned PEs; therefore, each columned PE requires access to the shared resource at a different time. This type of "shifted phase" relationship between each columned PE and the dedicated resource may obviate the need for arbitration on the bus when accessing the external memory. Further description of the staggered nature of processing activity among the PEs of a column, as well as description of the composition, functionality and operation of these and other components (e.g., the IHB 700, OHB 900, feedback line 350, external memory interfaces 310, remote processor interface 320, connection 325, mux 440, coprocessor 475, etc.) of the processor 300 are provided in the following copending applications: U.S. patent application Ser. No. 09/106,478, filed Jun. 29, 1998, entitled "PROGRAMMABLE ARRAYED PROCESSING ENGINE ARCHITECTURE FOR A NETWORK SWITCH"; U.S. patent application Ser. No. 09/106,436 filed Jun. 29, 1998, entitled, "ARCHITECTURE FOR A PROCESSOR COMPLEX OF AN ARRAYED PIPELINED PROCESSING ENGINE"; U.S. patent application Ser. No. 09/106,244 filed Jun. 29, 1998, entitled, "SYSTEM FOR CONTACT SWITCHING BETWEEN PROCESSING ELEMENTS IN A PIPELINE OF PROCESSING ELEMENTS," filed Jun. 29, 1998; and U.S. patent application Ser. No. 09/106,246 filed Jun. 29, 1998, entitled, "SYNCHRONIZATION is AND CONTROL SYSTEM FOR AN ARRAYED PROCESSING ENGINE." As noted previously, each of these copending applications is assigned to the Assignee of the subject application and is incorporated herein by reference.

In accordance with this embodiment of the present invention, each processor element CPU core 410 includes serial scan test chain and associated circuitry 413 of the type specified in IEEE Standard 1149.1, "Standard Test Access Port and Boundary-Scan Architecture," 1990, which IEEE Standard is incorporated herein in its entirety by reference. More specifically, in this embodiment, circuitry 413 may comprise conventional ARM7TDMI circuitry, manufactured by VLSI Technology, Inc. of San Jose, Calif., which includes conventional, serial built in scan test (BIST) circuitry, including scan chain and associated control circuitry (not shown) for testing internal registers and other circuitry comprised in the CPU core logic 411, based upon test inputs received from external test interface 102 via a respective test input signal path 415. It is important to note that although not shown in the Figures, each of the circuit paths 415 actually comprises a plurality of connections for propagating the test inputs for carrying out testing of the logic 411 using circuitry 413. Each respective path 415 is adapted to have the same signal propagation delay from the circuitry 508 (whose function will be described below) to the respective CPU 410 to which the respective path 415 is connected. Each CPU 410 generates respective test outputs in response to the test inputs received via its respective path 415. These respective test outputs are shifted out by the respective CPUs' scan circuitry 413 to respective test output signal paths 417 which propagate the respective test outputs to interface 102. Each respective path 417 is adapted to have the same signal propagation delay between the respective CPU 410 to which the respective path 417 is connected and the circuitry 508.

As shown in FIG. 4, in interface 102, each of the test output signal paths 417 is provided, as inputs, to both a comparator 502 and multiplexer 504. Comparator 502 compares the respective test outputs received via the plurality of circuit paths 417, and generates a fault signal if corresponding test outputs (i.e., signals having the same sequence order in the respective test outputs) are not identical, which fault signal is supplied by comparator 502 to external test interface pin 500 of interface 102. The design of circuitry 508 may be substantially based upon specifications set forth in the aforesaid IEEE Standard 1149.1.

When the comparator 502 outputs the fault signal via the pin 500, this indicates that the processor 300 is defective.

That is, since the CPUs 410 are intended to be replicated (i.e., identical) components, the CPUs 410 should produce identical test outputs when identical test inputs are supplied to them. Thus, if corresponding test outputs are not identical, this may indicate presence of defects in one or more of the CPUs 410. Of course, it is also possible that lack of identicality among corresponding test outputs is the result of defects in the testing circuitry 102, 415, and/or 417. However, it is most probable that the lack of identicality among corresponding test outputs, in fact, results from defects in one or more of the processor elements 400, rather than from defects in the circuitry 102, 415, and/or 417. Also, it should be noted that it is possible that all of the replicated components under test have identical defects that would generate, in response to application of the test inputs, identical respective test outputs. In order to detect such is identical defects, it is necessary to test the respective test outputs from the replicated components by comparing them with expected values therefor.

Multiplexer 504 is a 1 of N multiplexer (where N is the number of replicated CPUs 410 in processor 300). Multiplexer 504 receives as inputs the respective test outputs propagating on paths 417, and a selection control signal generated by circuitry 508 and transmitted to multiplexer 504 via connection 512. The selection control signal received by multiplexer 504 selects which of the respective test outputs received by the multiplexer 504 are output by the multiplexer 504. The selection control signal is generated by the circuitry 508 based upon the value stored in a control register 510 comprised in circuitry 508.

In operation, when it is desired to test the replicated CPUs 410 of the processor 300 for defects (e.g., after manufacture and prior to supply of the chip 300 to an intended end user thereof), the external test interface 102 of ASIC chip 300 is coupled to an appropriate corresponding interface (not shown) coupled to a conventional external test device (e.g., a computerized test system) 600 so as to permit test control and data signals generated by the device 600 to be supplied to the circuitry 508 via external test interface pins 514, and also so as to permit the signals propagating via external test interface pins 500, 506 to be supplied to device 600. Circuitry 508 supplies test inputs to the CPUs 410 via paths 415 based upon the signals supplied to circuitry 508 from device 600 via pin 514. Additionally, the signals supplied to circuitry 508 from the device 600 control the value that is loaded and stored in the register 510. Thus, by generating and supplying appropriate test control and data signals to the circuitry 508, the device 600 may control the test inputs that are supplied to the CPUs 410, and may also control which of the respective test outputs are supplied by multiplexer 504 to device 600 via pin 506.

Device 600 may be configured to cause, if the fault signal is asserted by the comparator 502, the circuitry 508 to execute a plurality of testing cycles to enable the device 600 to try to determine which of the CPUs 410 may contain defects. In the first such testing cycle, a set of serial test vectors may be supplied by the circuitry 508 to the CPUs 410, and respective test outputs generated by a predetermined CPU 410 in response to the vectors may be supplied to the device 600. In the next testing cycle, the set of serial test vectors may be again supplied by the circuitry 508 to the CPUs 410, and respective test outputs generated by another (i.e., different) predetermined CPU 410 in response to the vectors may be supplied to the device 600; this process may be repeated in each subsequent cycle, until respective test outputs generated by every one of the CPUs 410 have been supplied to the device 600. During each testing cycle, the device 600 may compare the respective test outputs that device 600 receives during that cycle to predetermined expected test outputs, and using conventional analysis techniques based upon such comparison, the device 600 may determine whether the CPU 410 generating the respective test outputs is likely to be defective. Once the device 600 has determined which of the CPUs 410 is likely to be defective, the device 600 may cause predetermined test inputs to be provided to the CPUs 410 that cause the likely-defective CPU(s) to generate test outputs from which the device 600 may deduce, via conventional analysis techniques, is the specific defective circuit(s) that may be present in the defective CPU(s).

Thus, it is evident that there has been provided, in accordance with the present invention, a technique for use in testing of replicated components of an electronic device that fully satisfies the aims and objectives, and achieves the advantages set forth above. As will be apparent to those skilled in the art, many alternatives, modifications, and variations of the embodiments described above are possible. For example, although the present invention has been described in connection with use in testing the replicated CPUs 410 of a parallel processor ASIC 300, it should be understood that if appropriately modified in ways apparent to those skilled in the art, the aforedescribed technique of the present invention may also be advantageously used to test for defects in other replicated electronic components (e.g., other components of the replicated processing elements 400 or the elements 400 themselves) of such ASIC 300, and/or may be used in testing replicated components in the types of electronic devices (e.g., memories, other types of processors, etc., not shown in the Drawings). Additionally, as will be appreciated by those skilled in the art, if appropriately modified, the processor 300 may also include the integrated debug capabilities, features, and circuitry described in the aforesaid copending application entitled, "PARALLEL PROCESSOR WITH DEBUG CAPABILITY", filed concurrently with the subject application, whose serial number has yet to be assigned.

Also, although ASIC 300 has been described as comprising only a single external serial test interface 102, if appropriately modified, ASIC 300 may instead comprise a respective external serial test interface (not shown) for each column of processor elements 400 in ASIC 300. That is, in this alternative embodiment, the ASIC 300 may comprise six external serial test interfaces (not shown), and the processor elements 400 of each respective column of the ASIC 300 be configured to receive test inputs from and transmit test outputs to, respectively, a respective one of these interfaces. The device 600 may be modified to permit device 600 to be coupled to these six external interfaces, and to control testing of the CPUs 410 and receive test outputs and respective faults signals via these interfaces.

Other modifications are also possible. Accordingly, the present invention should be viewed quite broadly, as being limited only as set forth in the hereinafter appended claims.

What is claimed is:

1. An electronic device comprising:
   a single test interface for receiving test inputs;
   a first plurality of circuit paths for transmitting, in parallel, said test inputs from said single test interface to each of a plurality of replicated electronic components under test, each of said components generating respective test outputs in response to said test inputs;
   a second plurality of circuit paths for transmitting, in parallel, said test outputs from said components to a comparator for generating a fault signal if difference exists between corresponding test outputs; and a multiplexer, wherein each of said components generates respective test outputs, said respective test outputs are supplied in parallel to both said comparator and said multiplexer, said multiplexer outputting selected test outputs to an external pin of said interface in response to a fault signal.

2. A device according to claim 1, wherein said interface is an external interface of said device.

3. A device according to claim 1, wherein said interface comprises a plurality of external pins, at least one of said pins being for propagating said fault signal.

4. A device according to claim 1, wherein each of said components comprises respective serial test scan chain circuitry for receiving said test inputs and for providing respective test outputs to said second plurality of circuit paths.

5. A device according to claim 1, wherein said device is a parallel processor, and said components are central processor units of said parallel processor.

6. A device according to claim 1, wherein said interface comprises test control circuitry for receiving test control signals from a source external to said device.

7. A device according to claim 1, wherein said interface comprises test control circuitry for supplying to said multiplexer a signal for selecting which of said respective test outputs is outputted by said multiplexer to said external pin.

8. An electronic device comprising:

a single external test interface for providing test inputs to a first plurality of circuit paths, said circuit paths being for propagating, in parallel, said test inputs from said single test interface to each of a plurality of replicated electronic components under test, said components generating respective test outputs in response to said test inputs; and a second plurality of circuit paths for transmitting, in parallel, said respective test outputs from said components to a multiplexer for outputting selected test outputs from the external test interface.

9. A device according to claim 8, wherein said interface comprises test control circuitry for supplying a selection signal to said multiplexer for selecting which of said respective test outputs to output from said interface.

10. A device according to claim 9, wherein said control circuitry comprises a register for being loaded with a value upon which said selection signal is based, said value being supplied via said interface from a source external to said device.

11. A device according to claim 9, wherein said interface comprises an external pin for supplying said selected test outputs to a recipient external to said device.

12. An electronic device comprising:

a plurality of replicated electronic circuits, each of said circuits generating respective test outputs in response to test inputs;

a comparator for outputting to an external interface of said device a fault signal if difference exists between corresponding respective test outputs; and a multiplexer for receiving said respective test outputs and for outputting only selected test outputs to said external interface in response to the fault signal.

13. A parallel processor comprising:

a plurality of parallel processing elements; and circuitry integrated in said parallel processor for testing said elements to determine whether a defect exists in said parallel processor and for generating a fault signal if said defect exists in said parallel processor, wherein said parallel processor is comprised in a single integrated circuit chip, and said circuitry comprises an external test interface configured to supply said fault signal, when said fault signal is asserted, to a device external to said chip and a multiplexer for supplying test outputs from a selected processor element of said plurality of processor elements to said device external to said chip when said fault signal is asserted.

14. A parallel processor according to claim 13, wherein each of said processor elements includes a central processing unit, and said circuitry is for testing each central processing unit of the parallel processor to determine whether each said central processing unit is defective.

15. An electronic device comprising:

a plurality of replicated components, each of said components generating respective test outputs in response to test inputs; and at least one comparator for outputting to a respective external interface of said device a respective fault signal if difference exists between corresponding test outputs of a respective group of said components, wherein said device includes a plurality of groups of said components, a plurality of comparators, and a plurality of external test interfaces, each of said interfaces including a respective comparator.

16. An electronic device comprising:

a plurality of replicated components, each of said replicated components generating respective test outputs in response to test inputs; and at least one multiplexer for receiving test outputs from a respective group of said components, and for outputting only selected test outputs from the test outputs of said respective group of said components to a respective external interface.

17. A device to claim 16, wherein said device includes a plurality of groups of said components, a plurality of multiplexers, and a plurality of external interfaces, each of said interfaces including a respective multiplexer.

18. A method for testing replicated components of an electronic device comprising:

providing a single test interface for receiving test inputs;

providing a first plurality of circuit paths for transmitting, in parallel, said test inputs from said single test interface to each of a plurality of replicated electronic components under test, each of said components generating respective test outputs in response to said test inputs;

providing a second plurality of circuit paths for transmitting, in parallel, said test outputs from said components to a comparator for generating a fault signal if difference exists between corresponding test outputs; and providing a multiplexer, wherein each of said components generates respective test outputs, said respective test outputs are supplied in parallel to both said comparator and said multiplexer, said multiplexer outputting selected test outputs to an external pin of said interface in response to a fault signal.

19. Electromagnetic signals travelling over a computer network comprising:

electromagnetic signals to execute in a computer for practicing the method of claim 18.

20. A computer readable medium containing executable program instructions according to the method of claim 18.

* * * * *